(12) United States Patent
Strandemar et al.

(10) Patent No.: US 7,809,258 B2
(45) Date of Patent: Oct. 5, 2010

(54) CAMERA AND METHOD FOR USE WITH CAMERA

(75) Inventors: Katrin Strandemar, Rimbo (SE); Malin Ingerhed, Sollentuna (SE)

(73) Assignee: FLIR Systems AB (SE)

( * ) Notice: Subject to any disclaimer, the term of this patent is extended or adjusted under 35 U.S.C. 154(b) by 263 days.

(21) Appl. No.: 11/773,982

(22) Filed: Jul. 6, 2007

(65) Prior Publication Data
US 2009/0010635 A1 Jan. 8, 2009

(51) Int. Cl.
*G03B 17/00* (2006.01)
(52) U.S. Cl. .......................................... 396/80
(58) Field of Classification Search ................ 396/133, 396/80
See application file for complete search history.

(56) References Cited

U.S. PATENT DOCUMENTS

| | | | |
|---|---|---|---|
| 5,757,429 A | 5/1998 | Haruki | |
| 6,560,029 B1* | 5/2003 | Dobbie et al. ............... | 359/631 |
| 6,972,797 B2 | 12/2005 | Izumi | |
| 7,158,296 B1 | 1/2007 | Schwartz, II et al. | |
| 7,307,793 B2 | 12/2007 | Ottney et al. | |
| 7,345,277 B2 | 3/2008 | Zhang | |
| 2006/0114320 A1* | 6/2006 | Nagaoka et al. ............. | 348/118 |
| 2007/0279514 A1* | 12/2007 | Mitsumine et al. .......... | 348/336 |

FOREIGN PATENT DOCUMENTS

| | | |
|---|---|---|
| EP | 0596444 A1 | 5/1994 |
| EP | 1299699 B1 | 8/2006 |
| WO | WO-01/96824 A1 | 12/2001 |
| WO | WO-2005/012953 A2 | 2/2005 |
| WO | WO-2006/060746 A2 | 6/2006 |

OTHER PUBLICATIONS

Dwyer, D. et al. (2004). "Real Time Implementation of Image Alignment and Fusion," *Proceedings of SPIE* 5612:85-93.
International Search Report mailed Nov. 11, 2008, for PCT Application No. PCT/SE2008/050790 filed Jun. 27, 2008, 5 pages.
International Written Opinion mailed Nov. 11, 2008, for PCT Application No. PCT/SE2008/050790 filed Jun. 27, 2008, 8 pages.

* cited by examiner

*Primary Examiner*—Rodney E Fuller
*Assistant Examiner*—Fang-Chi Chang

(57) ABSTRACT

An infrared ("IR") camera includes first and second imaging parts for capturing an IR image and a visible light image, respectively. The field of view of the second imaging part at least partially overlaps the field of view of the first imaging part. The first imaging part includes IR optics. The second imaging part includes visible light optics. The IR camera also includes a focus motor for focusing at least one of the IR optics or the visible light optics. A sensor is operable to determine the position of the focus motor. Based on the position of the focus motor, a processor determines actual displacement for aligning the IR and visual light images. The actual displacement includes displacement due to parallax error and error due to the angle between the optical axes of the first and second imaging parts.

10 Claims, 2 Drawing Sheets

CAMERA AND METHOD FOR USE WITH CAMERA

TECHNICAL FIELD

The present invention relates to a camera for producing IR images and visible light images and images comprising a mix of IR and visible light data, and to a method for use with such a camera.

BACKGROUND AND RELATED ART

In recent years methods and cameras have been proposed for combining IR images and visible light images in various ways, often referred to as image fusion. Typically, a camera will have an imaging part for capturing IR image data, another imaging part for capturing visible light image data and means for processing the image data in such a way that they can be displayed in the same image. Such functions may be helpful, for example, in identifying the position of a hot, or cold, object.

Typically, the field of view of the visible light image is greater than the field of view of the IR image. In any case the fields of view will differ, since the optical systems capturing the two images will not be placed in exactly the same position. This is a well known optical phenomenon called parallax. Hence, before displaying a fused, or blended, image the two images must be aligned. Also, since the resolution of the visible light image typically differs from that of the IR image, at least one image must be rescaled so the images will match each other.

EP patent 1 299 699 discloses a method of displaying visible light image data and IR image data in the same image, and a camera comprising imaging means both for IR radiation and visible light. The data can be combined in a number of different ways, for example, in dependence of the temperature of the respective pixels.

This patent also mentions the need for correcting the parallax caused by the image capturing means for IR and visible light, respectively, being placed at a certain distance from each other. Two main methods of parallax correction are suggested: by optical means such as mirrors or by electronic means. How to correct the parallax by electronic means is not discussed in detail.

International patent application WO2006/060746 discloses parallax correction based on the distance to the object. The distance to the object is in turn determined by the focusing distance. The method suggested in WO 2006/060746 is to use a magnet mounted on the IR lens and a Hall sensor mounted in the optics housing, or vice versa, whereby the Hall sensor will measure the distance to the magnet and hence the focusing distance. The actual focusing of the camera is performed manually, in a way known per se, by turning a focus ring. As an alternative it is suggested to align the images by manually displacing one relative the other until they overlap correctly.

A number of ways of combining the IR and visible light image data are proposed in WO 2006/060746. For example, the visible image may be shown in a grey scale and the IR image superimposed on this image in colour. Alternatively, the visible light image may be displayed, but for pixels in which the temperature values exceed a certain threshold value the visible light pixels may be replaced by IR image pixels.

When aligning the IR and visible light images, however, it should be taken into account that the actual displacement of the images relative to each other is not simply a function of parallax, that is the displacement caused by the distance between the imaging parts for IR and visible light, respectively. Typically, there will also be an angle between the optical axes of the imaging parts.

Whereas a pure parallax error always decreases with the distance to the object, the actual displacement between the images in this case may decrease or increase with the distance to the object depending on the angle between the optical axes.

The present invention suggests an alternative method of aligning the visible light and IR images to the one proposed in WO2006/060746, in particular a method of taking into account the actual displacement of the images, not just the parallax error.

SUMMARY OF THE INVENTION

According to a first aspect of the invention, a camera is provided comprising a first imaging part for capturing IR image data of a first field of view, said first imaging part comprising IR optics, a second imaging part for capturing visible light data of a second field of view at least partially overlapping the first field of view, said second imaging part comprising visible light optics, and means for adjusting the first and second field of view relative to each other in dependence of the focusing distance of the first or second imaging part. At least the first or second imaging part comprises a motor for focusing of the IR optics or visible light optics, respectively, said camera further comprising sensing means arranged to sense the position of the motor and processing means arranged to determine the displacement needed to align the images based on the position of the focus motor.

Further, a method of displaying a fused image comprising IR image data captured with a first imaging part of a camera and visible light image data captured with a second imaging part of the camera, said method comprising capturing IR image data and visible image data Performing focusing by means of a focus motor, Sensing the position of the focus motor, Determining the displacement needed to align the IR image data and the visible light image data based on the position of the focus motor, Performing the displacement to align the images.

Hence, according to the invention, the focusing function itself is used to determine the amount of displacement needed. This is based on the insight that the displacement is dependent on the distance to the object, which is in turn related to the focusing distance of the camera. Preferably the focusing distance of the IR part of the camera is used, but the focusing distance of the visible light part of the camera could be used instead if a suitable focusing mechanism is provided in the visible light part. The focus motor may be used for automatic focusing, or may be controlled manually, or a combination of the two.

In one embodiment the processing means is arranged to determine the displacement by determining the focusing distance on the basis of the position of the focus motor and determining the displacement needed to align the IR image data and the visible light image data based on the focusing distance. In this case, the processing means is arranged to determine the displacement by determining the distance to the object on the basis of the focusing distance and determining the displacement needed to align the IR image data and the visible light image data based on the distance to the object. The skilled person will understand that the method can be implemented using one or more of these intermediate steps, or the displacement can be determined directly from the position of the motor.

BRIEF DESCRIPTION OF THE DRAWINGS

The invention will be discussed in more detail in the following, by way of example and with reference to the appended drawings, in which.

DETAILED DESCRIPTION OF EMBODIMENTS

Figure 1:
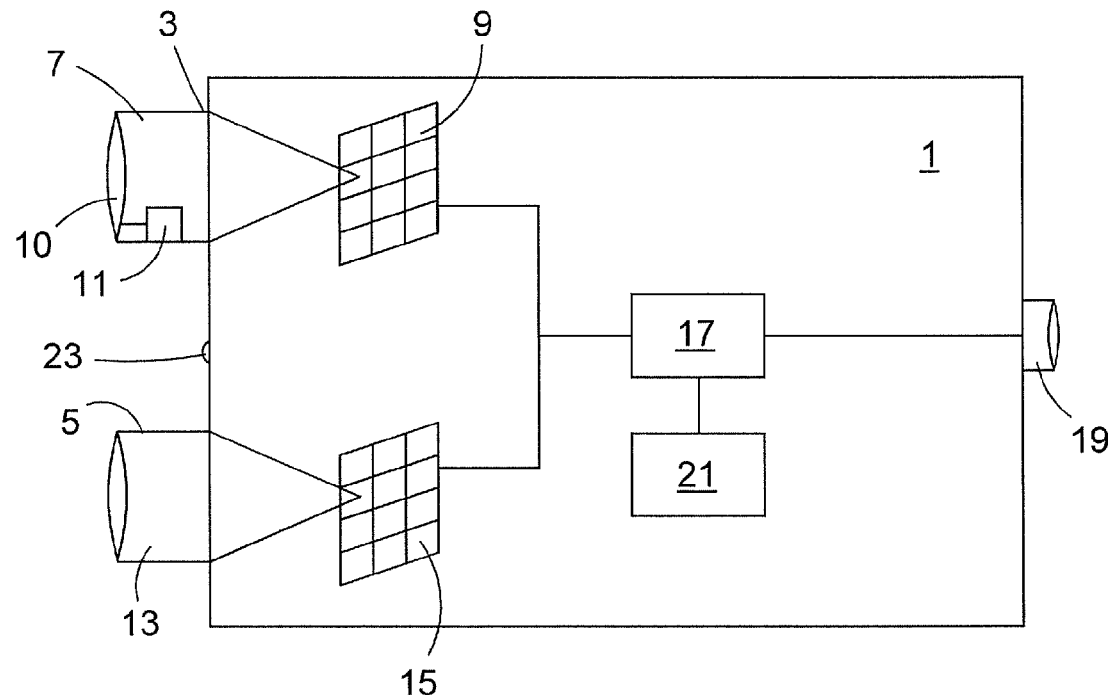
FIG. 1 illustrates a camera that may be used according to the invention

FIG. 1 illustrates schematically a camera 1 having a first imaging part 3 for capturing IR images and a second imaging part 5 for capturing visible light images. The first imaging part 3 comprises IR optics 7 that focuses incoming IR radiation onto an array 9 of IR sensing elements in a way known per se. Preferably the IR optics part comprises one or more IR lenses 10, one of which is driven by a motor 11. The second imaging part comprises visible light optics 13 for focusing the incoming visible light onto an array 15 of visible light sensing elements in a way known per se. The data registered by the array 9 are forwarded to a processing unit 17 that processes the data to produce a suitable image, which may be a visible light image, an IR image or a fused image of IR and visible light images. The camera also preferably comprises a display device 19 at least one memory unit 21 for storing registered image data and/or processed images.

According to the invention, the processing unit 17 is in particular arranged to determine the displacement, resealing and other functions needed to align the IR image and the visible light image. A method of determining the displacement according to aspects of the invention will be discussed in the following. As will be understood by the skilled person, this method is preferably implemented in the form of computer code stored in or in connection to the processing unit.

The camera is preferably also provided with a laser pointer 23, known per se, which may be used to point out objects in the image.

The focusing distance may be used to determine the distance between the camera optics and the object being imaged. Preferably the focusing distance of the IR imaging part is used but the focusing distance of the visible light imaging part can be used instead, or in addition if a suitable focusing mechanism is available for this part. The focusing distance in turn may be determined in a number of ways.

According to the invention it is assumed that a focusing motor 11 is present for providing an autofocusing and/or manual focusing function. In this case, the position of the motor can be used to determine the position of the optics, which is in turn indicative of the focusing distance.

Figure 2:
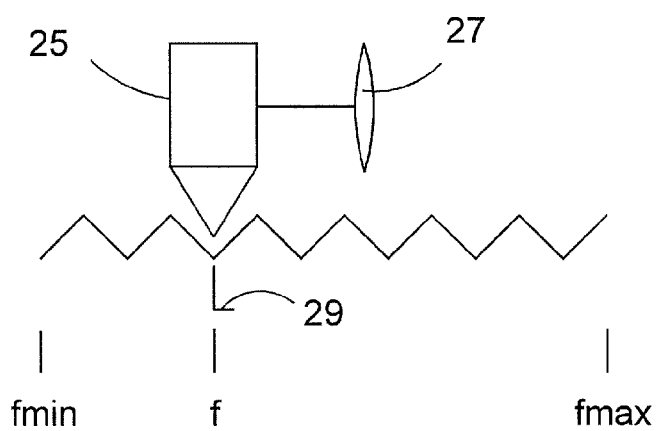
FIG. 2 illustrates an optical system comprising a motor for automatic focusing of the IR lens.

FIG. 2 illustrates this principle in an optical system comprising a motor 25 for automatic focusing of a lens, typically an IR lens 27. The focusing function is performed automatically or manually in a way known in the art. To focus the optics the motor moves between a minimum focusing position fmin and a maximum focusing position fmax along a stick that is provided with threads or cogs. A position sensing means 29 senses the current position f of the motor and determines the focusing distance based on this position. The nature of the position sensing means 29 is dependent on the type of motor used. The focusing distance can then be obtained indirectly by steering the lens to a desired absolute position using a high resolution motor and assuming that it ends up in the correct position. Alternatively the focusing distance may be obtained directly by steering the lens to a desired position and controlling this using feedback control from a position measuring potentiometer.

Generally, absolute lens position feedback may be obtained using high performance potentiometers.

Figure 3:
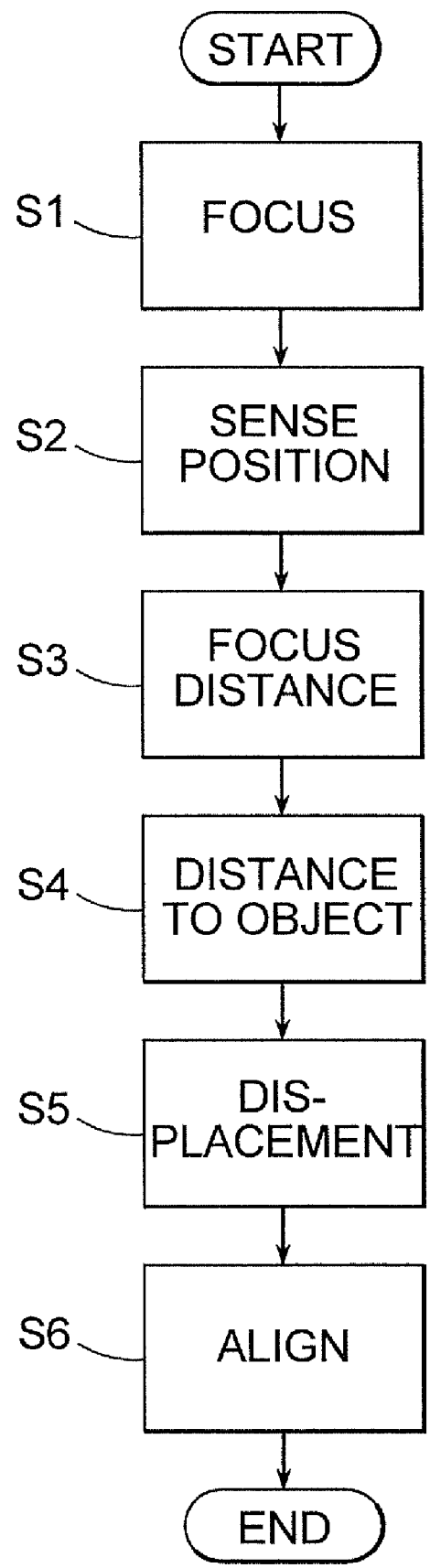
FIG. 3 illustrates a method according to the invention.

Hence, the method according to the invention comprises the following steps, as illustrated in FIG. 3:

Step S1: Perform focusing, automatically or by manual control of the focus motor.

Step S2: Sense the position of the focus motor.

Step S3: Determine the focusing distance, that is the position of the at least one lens relative to another lens or another fix point, on the basis of the position of the focus motor. The focus distance is a known function g(f,T), f being the focus position of the focus motor and T being the temperature.

Step S4: Determine the distance z to the object on the basis of the focusing distance dF.

Step S5: Determine the displacement needed to align the images based on the distance to the object.

Step S6: Perform the displacement determined in step S5 to align the images.

The focusing distance dF in step S3 can be expressed as $$dF = a/z + b \quad (1)$$

where a is a constant indicating the contribution of the parallax to the distance between the images.

b is a constant dependent on the focusing distance in the case of far focus and z is the distance to the object. The constant indicates the contribution to the distance between the images caused by the angle between the optical axes. The parameters a and b may be obtained for each individual motor in a calibration procedure in which the motor's position is sensed at least twice, when focusing at two different distances between the camera and the object. The motor's positions and the distances to the object can then be used to determine a and b.

Once the focusing distance is known, therefore, the distance z to the object can be obtained as $$z = a/(dF - b) \quad (2)$$

The distance z can be used to determine the displacement needed of the IR image and the visible light image relative to each other, according to the equations $$Tx = ax/z + bx \quad (3)$$

$$Ty = ay/z + by \quad (4)$$

Here Tx indicates the horizontal displacement, Ty indicates the vertical displacement, ax, bx, ay and by are constants representing the horizontal and vertical displacement, respectively. Instead of the displacement, Tx and Ty may indicate a point in the visual light image in which, for example, the upper left corner, or the centre, or another point in the IR image should be placed.

The constants ax, bx, ay and by are determined for each camera in calibration proceedings before delivery. How to do this is well known in the art As will be understood, steps S3 and S4 do not have to be carried out as separate steps. The important thing according to the invention is that the displacement is determined on the basis of the focusing distance, which can be done directly from the position of the focus motor, for example by means of a determined relationship between the position of the focus motor and the distance to the object. This relationship may be stored, for example, as a function, or as a look-up table, in the memory unit 19.

As mentioned above, Tx and Ty can be determined directly from the focus distance. Substituting Eq (2) for z in Eqs. (3) and (4) yields $$Tx = ax(dF-b)/a+bx \quad (5)$$

$$Ty = ay(dF-b)/a+by \quad (6)$$

Eqa. (5) and (6) can be simplified as:

$$Tx = c1x*d + c2x \quad (7)$$

$$Ty = c1y*d + c2y. \quad (8)$$

Hence, a linear relationship is obtained between the lens position d and the translation required, since c1c, c2x, c1y and c2y are constants.

If the distance z to the object is determined in step S4, this distance can be output to the operator if a general information about the distance to the object is desired.

The equations and constants needed to perform the calculations described above are preferably stored in the memory unit 21 or in another memory unit in the camera.

The invention claimed is:

1. An infrared ("IR") camera comprising:
   a first imaging part for capturing an IR image of a first field of view, wherein the first imaging part includes IR optics;
   a second imaging part for capturing a visible light image of a second field of view at least partially overlapping the first field of view, wherein the second imaging part includes visible light optics;
   a focus motor for focusing at least one of the IR optics or the visible light optics;
   a sensor for determining a distance parameter related to a distance to an object; and
   a processor for determining actual displacement for aligning the IR and visible light images based on the distance parameter displacement due to parallax error, and error due to the angle between the optical axes of the first and second imaging parts.

2. The IR camera according to claim 1, wherein the determined actual displacement is based on a focusing distance.

3. The IR camera according to claim 1, wherein the determined actual displacement is based on the position of the focus motor.

4. The IR camera according to claim 1, wherein the focus motor is operable to focus the first imaging part.

5. A method for aligning IR image data captured by a first imaging part of an IR camera and visible light image data captured by a second imaging part of the IR camera, the method comprising:
   focusing at least one of the first or second imaging parts with a focus motor;
   capturing IR image data and visible light image data with the first imaging part and the second imaging part, respectively;
   sensing a distance parameter related to a distance to an object;
   determining actual displacement for aligning the IR image data and the visible light image data based on the distance parameter, displacement due to parallax error, and error due to the angle between the optical axes of the first and second imaging parts; and
   aligning the IR image data and visible light image data based on the determined actual displacement.

6. The method according to claim 5, further comprising:
   determining a focusing distance based on the position of the focus motor; and
   determining actual displacement for aligning the IR image data and the visible light image data based on the focusing distance.

7. The method according to claim 5, further comprising:
   determining the distance to the object based on a focusing distance of at least one of the first or second imaging part; and
   determining actual displacement for aligning the IR image data and the visible light image data based on the distance to the object.

8. The method according to claim 5, wherein the focus motor focuses the first imaging part.

9. An infrared ("IR") camera comprising:
   a first imaging part for capturing an IR image of a first field of view, wherein the first imaging part includes IR optics;
   a second imaging part for capturing a visible light image of a second field of view at least partially overlapping the first field of view, wherein the second imaging part includes visible light optics;
   a sensor for determining a focusing distance of at least one of the IR or visible light optics; and
   a processor for determining actual displacement for aligning the IR and visible light images based on the focusing distance, displacement due to parallax error, and error due to the angle between the optical axes of the first and second imaging parts.

10. A method for aligning IR image data captured by a first imaging part of an IR camera and visible light image data captured by a second imaging part of the IR camera, the method comprising:
    focusing at least one of the first or second imaging parts with a focus motor;
    capturing IR image data and visible light image data with the first imaging part and the second imaging part, respectively;
    sensing a focusing distance of at least one of the first imaging part or the second imaging part;
    determining actual displacement for aligning the IR image data and the visible light image data based on the focusing distance, displacement due to parallax error, and error due to the angle between the optical axes of the first and second imaging parts; and
    aligning the IR image data and visible light image data based on the determined actual displacement.

\* \* \* \* \*